(12) United States Patent
Takezawa et al.

(10) Patent No.: US 11,047,044 B2
(45) Date of Patent: Jun. 29, 2021

(54) FILM FORMING APPARATUS AND FILM FORMING METHOD

(71) Applicant: TOKYO ELECTRON LIMITED, Tokyo (JP)

(72) Inventors: Yoshihiro Takezawa, Nirasaki (JP); Kuniyasu Sakashita, Nirasaki (JP); Shigeru Nakajima, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 213 days.

(21) Appl. No.: 15/841,084

(22) Filed: Dec. 13, 2017

(65) Prior Publication Data

US 2018/0179630 A1 Jun. 28, 2018

(30) Foreign Application Priority Data

Dec. 22, 2016 (JP) .............................. JP2016-249085

(51) Int. Cl.
*C23C 16/455* (2006.01)
*C23C 16/458* (2006.01)
(Continued)

(52) U.S. Cl.
CPC ...... *C23C 16/45544* (2013.01); *C23C 16/405* (2013.01); *C23C 16/4412* (2013.01);
(Continued)

(58) Field of Classification Search
CPC ........ C23C 16/45544; C23C 16/45502; C23C 16/4583; C23C 16/405; C23C 16/45565;
(Continued)

(56) References Cited

U.S. PATENT DOCUMENTS

2014/0087565 A1* 3/2014 Yamaguchi ......... C23C 16/4401
438/758

FOREIGN PATENT DOCUMENTS

JP 2005-256137 A 9/2005
JP 2010-132958 A 6/2010
(Continued)

OTHER PUBLICATIONS

Machine Translation, JP 2011238832 (Year: 2011).*

*Primary Examiner* — Michael P Wieczorek
*Assistant Examiner* — Michael G Miller
(74) *Attorney, Agent, or Firm* — Nath, Goldberg & Meyer; Jerald L. Meyer; Tanya E. Harkins

(57) ABSTRACT

A film forming apparatus includes: a substrate holding member for vertically holding target substrates at predetermined intervals in multiple stages; a process vessel for accommodating the substrate holding member; a processing gas introduction member each having gas discharge holes which discharge a processing gas for film formation in a direction parallel to each target substrate and introduce the processing gas into the process vessel; an exhaust mechanism for exhausting the interior of the process vessel; and a plurality of gas flow adjustment members installed to face the target substrates, respectively. Each of the gas flow adjustment members adjusts a gas flow of the processing gas discharged horizontally above each of the target substrates from the gas discharge holes of the processing gas introduction member, to be directed from above the respective target substrate located below the respective gas flow adjustment member toward the surface of the respective target substrate.

11 Claims, 9 Drawing Sheets

(51) Int. Cl.
  *C23C 16/44* (2006.01)
  *H01L 21/673* (2006.01)
  *H01L 21/02* (2006.01)
  *C23C 16/40* (2006.01)
  *H01L 21/67* (2006.01)

(52) U.S. Cl.
  CPC ........ *C23C 16/458* (2013.01); *C23C 16/4583* (2013.01); *C23C 16/45502* (2013.01); *C23C 16/45565* (2013.01); *H01L 21/0228* (2013.01); *H01L 21/02181* (2013.01); *H01L 21/67017* (2013.01); *H01L 21/67109* (2013.01); *H01L 21/67303* (2013.01); *H01L 21/67309* (2013.01)

(58) Field of Classification Search
  CPC .............. C23C 16/4412; C23C 16/458; C23C 16/45591; C23C 16/45559; C23C 16/45546; H01L 21/67309; H01L 21/67109; H01L 21/67017; H01L 21/0228; H01L 21/02181; H01L 21/67303
  USPC ..................... 118/715–733; 427/248.1–255.7
  See application file for complete search history.

(56) References Cited

FOREIGN PATENT DOCUMENTS

| | | | |
|---|---|---|---|
| JP | 2011238832 A | * | 11/2011 |
| JP | 2017-55104 A | | 3/2017 |
| TW | 201530664 A | | 8/2015 |

\* cited by examiner

FIG. 2

| Raw material gas supply | Raw material gas purge | Reaction gas supply | Reaction gas purge |
|---|---|---|---|

Raw material gas

Reaction gas

FILM FORMING APPARATUS AND FILM FORMING METHOD

CROSS-REFERENCE TO RELATED APPLICATION

This application is based upon and claims the benefit of priority from Japanese Patent Application No. 2016-249085, filed on Dec. 22, 2016, the entire contents of which are incorporated herein by reference.

TECHNICAL FIELD

The present disclosure relates to a film forming apparatus and a film forming method which perform a film forming process on a plurality of target substrates arranged in multiple stages along a vertical direction.

BACKGROUND

For example, in manufacturing a semiconductor device, a batch type vertical heat treatment apparatus is widely used to perform a heat treatment such as a diffusion process, a film forming process, or an oxidation process with respect to substrate such as a semiconductor wafer. In the batch type vertical heat treatment apparatus, a quartz boat on which a plurality of substrates is vertically arranged in multiple stages is carried into a vertical process vessel made of quartz. Gas is supplied to the substrates by a gas injector which extends in the arrangement direction of the substrates and has a plurality of gas discharge holes formed at positions corresponding to the respective substrates. The substrates are heated by a heater installed around the process vessel.

In recent years, along with miniaturization and structural complication of semiconductor devices, in the case where such a vertical heat treatment apparatus is used for a film forming process using a chemical vapor deposition (CVD) method or an atomic layer deposition (ALD) method, in-plane uniformity in film thickness is required.

To meet such requirement, for example, there is known a technique in which annular (ring-shaped) members are respectively arranged to face process surfaces of a plurality of substrates vertically arranged in multiple stages.

However, with the progress of recent miniaturization and structural complication of semiconductor devices, in-plane uniformity in film thickness is further required. In particular, the in-plane uniformity and the coverage performance are further required for a high-k film such as an $HfO_2$ film. As such, conventional techniques may be not sufficient to meet requirements.

SUMMARY

The present disclosure provides some embodiments of a film forming apparatus and a film forming method which are capable of improving film thickness in-plane uniformity and coverage performance in performing a film forming process on a plurality of substrates arranged in multiple stages along a vertical direction.

According to one embodiment of the present disclosure, there is provided a film forming apparatus for forming a film on a surface of a target substrate, including: a substrate holding member configured to hold a plurality of target substrates at predetermined intervals in multiple stages along a vertical direction; a process vessel configured to accommodate the substrate holding member which holds the plurality of target substrates; a processing gas introduction member each having a plurality of gas discharge holes configured to discharge a processing gas for film formation in a direction parallel to each of the plurality of target substrates accommodated in the process vessel and configured to introduce the processing gas into the process vessel; an exhaust mechanism configured to exhaust the interior of the process vessel; and a plurality of gas flow adjustment members installed to face the plurality of target substrates, respectively, wherein each of the plurality of gas flow adjustment members is configured to adjust a gas flow of the processing gas discharged horizontally above each of the plurality of target substrates from the plurality of gas discharge holes of the processing gas introduction member, to be directed from above the respective target substrate located below the respective gas flow adjustment member toward the surface of the respective target substrate.

According to another embodiment of the present disclosure, there is provided a film forming method of forming a film on a surface of a target substrate using a film forming apparatus which includes a substrate holding member configured to hold a plurality of target substrates at predetermined intervals in multiple stages along a vertical direction, a process vessel configured to accommodate the substrate holding member that holds the plurality of target substrates, a processing gas introduction member having a plurality of gas discharge holes formed therein and for discharging a processing gas for film formation in parallel with the plurality of target substrates accommodated in the process vessel and configured to introduce the processing gas into the process vessel, and an exhaust mechanism configured to exhaust an interior of the process vessel, the film forming method including: adjusting a gas flow of the processing gas discharged horizontally above each of the plurality of target substrates from the plurality of gas discharge holes of the processing gas introduction member to be directed from above the respective target substrate located below the processing gas introduction member toward the surface of the respective target substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a diagram illustrating a gas supply sequence when a film is formed by an ALD method using the film forming apparatus of FIG. 1.

DETAILED DESCRIPTION

Embodiments of the present disclosure will now be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Overview of Apparatus>

Figure 1:
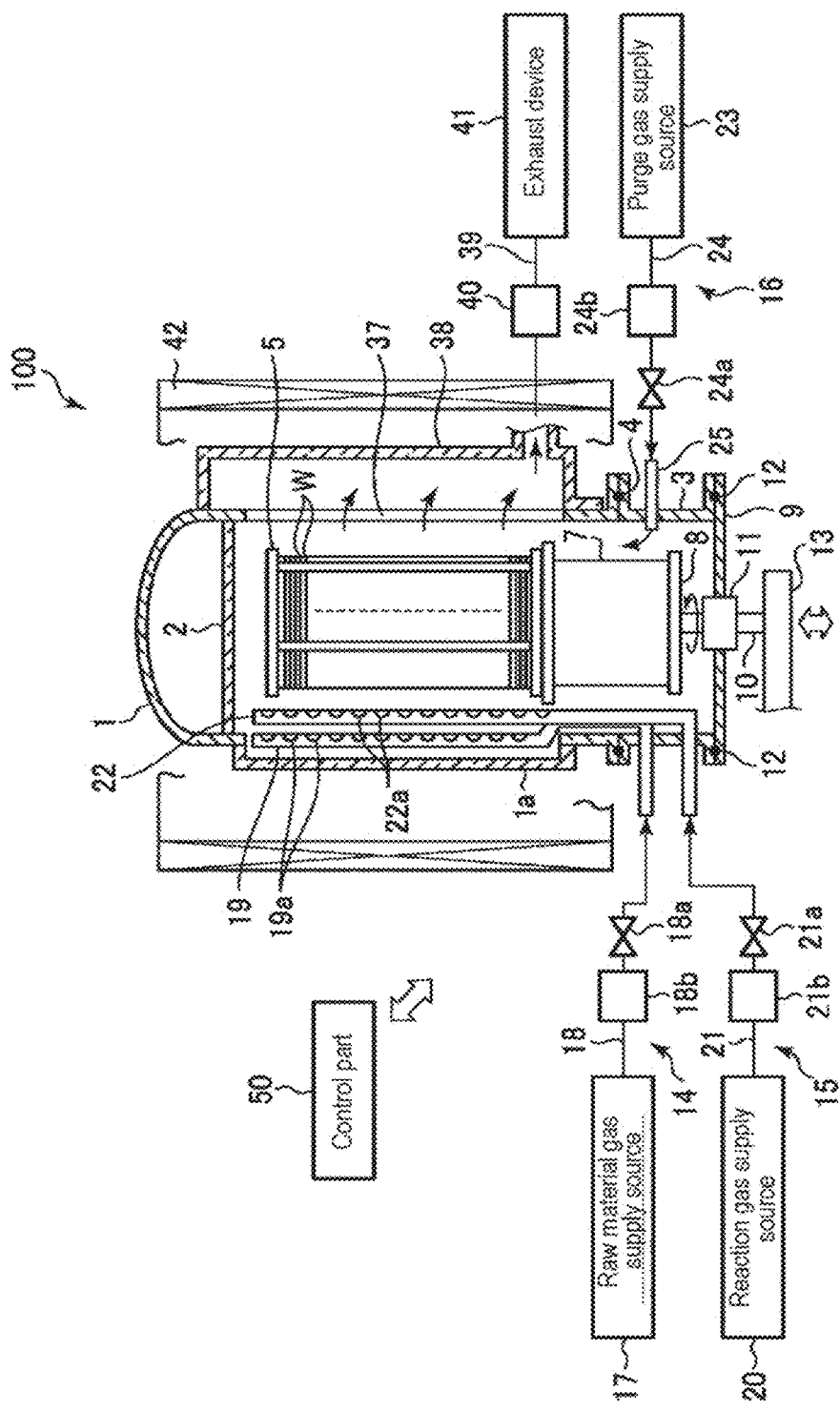
FIG. 1 is a cross sectional view illustrating a schematic configuration of a film forming apparatus configured as a vertical heat treatment apparatus to which the present disclosure is applied.

First, a schematic configuration of a film forming apparatus configured as a vertical heat treatment apparatus to which the present disclosure is applied will be described. FIG. 1 is a cross sectional view illustrating a schematic configuration of a vertical heat treatment apparatus to which the present disclosure is applied.

A film forming apparatus 100 of this embodiment includes a cylindrical process vessel 1 having a ceiling with a lower end opened. The entire process vessel 1 is made of, e.g., quartz, and includes a ceiling plate 2 made of quartz installed in the ceiling of the process vessel 1 so as to seal the process vessel 1. As will be described later, the process vessel 1 is heated by a heating device and is configured as a hot-wall-type film forming apparatus. A manifold 3 formed in a cylindrical shape by, for example, stainless steel, is connected to a lower end opening of the process vessel 1 via a seal member 4 such as an O-ring.

The manifold 3 supports the lower end of the process vessel 1. A wafer boat 5 made of quartz on which a plurality of, e.g., about 25 to 75 semiconductor wafers (hereinafter, simply referred to as wafers) W, are stacked in multiple stages as substrates to be processed from a lower side of the manifold 3, is configured to be inserted into the process vessel 1. The structure of the wafer boat 5 will be described later in detail.

The wafer boat 5 is mounted on a table 8 via a heat insulating cylinder 7 made of quartz. The table 8 is supported on a rotary shaft 10 that penetrates a lid 9 made of, e.g., stainless steel for opening and closing a lower end opening of the manifold 3.

Furthermore, for example, a magnetic fluid seal 11 is installed in the penetrating portion of the rotary shaft 10, and rotatably supports the rotary shaft 10 while hermetically sealing the rotary shaft 10. In addition, a seal member 12 made of, e.g., an O-ring is interposed between the peripheral portion of the lid 9 and the lower end portion of the manifold 3, thereby maintaining the sealing property inside the process vessel 1.

The rotary shaft 10 is attached to a leading end of an arm 13 supported by an elevating mechanism (not shown) such as, e.g., a boat elevator, so that the wafer boat 5, the lid 9 and the like are integrally moved up and down so as to be inserted into the process vessel 1. In some embodiments, the table 8 may be fixedly installed at the side of the lid 9, so that the wafers W are processed without rotating the wafer boat 5.

The film forming apparatus 100 includes a plurality of gas supply mechanisms configured to respectively supply a plurality of gases as processing gases required for a film to be formed by an ALD method or a CVD method. For example, the film forming apparatus 100 includes: a raw material gas supply mechanism 14 configured to supply a raw material gas (precursor) containing constituent elements of a film to be formed, as a processing gas to be supplied into the process vessel 1; a reaction gas supply mechanism 15 configured to supply a reaction gas reacting with the raw material gas, as a processing gas to be supplied into the process vessel 1; and a purge gas supply mechanism 16 configured to supply a purge gas into the process vessel 1.

The raw material gas supply mechanism 14 includes a raw material gas supply source 17, a raw material gas pipe 18 for guiding the raw material gas from the raw material gas supply source 17 therethrough, and an opening/closing valve 18a and a flow rate controller 18b such as a mass flow controller, which are installed in the raw material gas pipe 18.

The reaction gas supply mechanism 15 includes a reaction gas supply source 20, a reaction gas pipe 21 for guiding the reaction gas from the reaction gas supply source 20 therethrough, and an opening/closing valve 21a and a flow rate controller 21b such as a mass flow controller, which are installed in the reaction gas pipe 21.

The purge gas supply mechanism 16 includes a purge gas supply source 23, a purge gas supply pipe 24 for guiding the purge gas from the purge gas supply source 23 therethrough, and an opening/closing valve 24a and a flow rate controller 24b such as a mass flow controller, which are installed in the purge gas supply pipe 24.

A gas injector 19 as a gas introduction member for introducing the raw material gas into the process vessel 1 is connected to the raw material gas pipe 18. The gas injector 19 is made of quartz and has a horizontal portion that penetrates a sidewall of the manifold 3 inwardly, and a vertical portion which is bent from the horizontal portion by 90 degrees and extends up to an upper end of the wafer boat 5 inside the process vessel 1. The vertical portion of the gas injector 19 includes a plurality of gas discharge holes 19a formed therein. The plurality of gas discharge holes 19a horizontally discharges the raw material gas toward each wafer W therethrough.

Similarly, a gas injector 22 as a gas introduction member for introducing the reaction gas into the process vessel 1 is connected to the reaction gas pipe 21. Similar to the gas injector 19, the gas injector 22 is made of quartz and has a horizontal portion that penetrates the sidewall of the manifold 3 inwardly, and a vertical portion that extends up to the upper end of the wafer boat 5. The vertical portion of the gas injector 22 includes a plurality of gas discharge holes 22a formed therein. The plurality of gas discharge holes 22a horizontally discharges the reaction gas toward each wafer W therethrough.

A purge gas nozzle 25 for introducing the purge gas into the process vessel is connected to the purge gas supply pipe 24.

Examples of the film to be formed is not particularly limited, but may include an oxide film such as $ZrO_2$, $HfO_2$, $TiO_2$, $Al_2O_3$, $SiO_2$ or the like, a nitride film such as HfN, TiN, AlN, SiN, or the like, and a composite film obtained by combining the compounds such as ZrAlO, HfAlO, HfSiON or the like. The raw material gas (precursor) and the reaction gas (an oxide gas or a nitride gas) may be appropriately set according to a film to be formed.

In the in-plane uniformity of film thickness, particularly a high-k film such as an $HfO_2$ film tends to be problematic, the high-k film is desirable. For example, when an $HfO_2$ film is formed, an organic hafnium compound such as tetrakisdimethylamino hafnium ($Hf(NCH_3)_2)_4$: TDMAH), hafnium chloride ($HfCl_4$) or the like is used as the raw material gas, and an oxidizing agent such as an $O_3$ gas, an $H_2O$ gas, an $O_2$ gas, an $NO_2$ gas, an NO gas, an $N_2O$ gas or the like is used as the reaction gas.

In a case where a film to be formed requires a plurality of raw material gases or reaction gases, the number of raw material gas supply mechanisms, reaction gas supply mechanisms and gas injectors may be appropriately increased. Furthermore, two or more gas injectors may be installed for a single gas.

It may be possible to use, for example, an inert gas such as an $N_2$ gas or an Ar gas as the purge gas.

A protruded portion 1a is formed in one side surface of the process vessel 1 along a height direction. The gas injector 22 for the reaction gas is arranged in an internal space of the protruded portion 1a. On the other hand, the gas injector 19 for the raw material gas is installed at a position adjacent to the protruded portion 1a.

In some embodiments, a plasma generation mechanism may be installed in the protruded portion 1a so as to plasmarize the reaction gas.

In the process vessel 1, an exhaust port 37 for vacuum-exhausting the interior of the process vessel 1 therethrough is formed at an opposite side of the protruded portion 1a of the process vessel 1. The exhaust port 37 is formed to be elongated in the vertical direction of the sidewall of the process vessel 1. An exhaust port cover member 38 molded to have a U-shaped section so as to cover the exhaust port 37 is attached to a portion corresponding to the exhaust port 37 of the process vessel 1. An exhaust pipe 39 for exhausting the interior of the process vessel 1 via the exhaust port 37 is connected to a lower portion of the exhaust port cover member 38. An exhaust device 41 including a pressure control valve 40 for controlling an internal pressure of the process vessel 1, a vacuum pump and the like is connected to the exhaust pipe 39, so that the interior of the process vessel 1 is exhausted by the exhaust device 41 via the exhaust pipe 39 and is also controlled to have a predetermined pressure.

A cylindrical heating device 42 for heating the process vessel 1 and the wafers W accommodated in the process vessel 1 is installed outside the process vessel 1 so as to surround the process vessel 1. A resistance heater is incorporated in the heating device 42.

The film forming apparatus 100 includes a control part 50. The control part 50 controls the respective components of the film forming apparatus 100, for example, the valves, the mass flow controllers which are the flow rate controllers, the driving mechanism such as the elevating mechanism, the power source of the heater, and the like. The control part 50 includes a CPU (computer), and is composed of a main controller for executing the above control, an input device, an output device, a display device, and a storage device. In the storage device, a storage medium storing a program for controlling processes executed by the film forming apparatus 100, i.e., a process recipe, is set. The main controller reads out a predetermined process recipe stored in the storage medium and controls the film forming apparatus 100 to perform a predetermined process based on the process recipe.

In the film forming apparatus 100 configured as above, unprocessed wafers W as target substrates are transferred to the wafer boat 5 by a transfer mechanism (not shown) installed below the process vessel 1. The wafer boat 5 is elevated by the elevating mechanism. The manifold 3 and the lid 9 are brought into close contact with each other by the seal member 12 so that the interior of the process vessel 1 is sealed.

Thereafter, the interior of the process vessel 1 is regulated to a predetermined pressure of, for example, 0.1 to 100 Torr (13.3 to 13,330 Pa), and subsequently, the opening/closing valve 24a is opened to allow the purge gas to flow at a predetermined flow rate so as to purge the interior of the process vessel 1. In this state, the interior of the process vessel 1 is heated in advance by the heating device 42 so that the temperature of a center portion (a center portion in the vertical direction) of the wafer boat 5 becomes a predetermined temperature which falls within a range of, for example, 300 to 700 degrees C.

In this state, a predetermined film is formed by simultaneously supplying the raw material gas and the reaction gas by the CVD method while rotating the wafer boat 5 or alternately supplying the raw material gas and the reaction gas with the purge gas interposed therebetween by the ALD method which sequentially performs the adsorption of the raw material gas and the reaction of the adsorbed raw material gas with the reaction gas, as illustrated in FIG. 2. The purging of the raw material gas and the purging of the reaction gas are performed by supplying the purge gas into the process vessel 1 while exhausting the interior of the process vessel 1. By the ALD method, it is possible to form a film more uniform and excellent in coverage than the CVD method.

<Conventional Gas Flow to Wafer>

Figure 3:
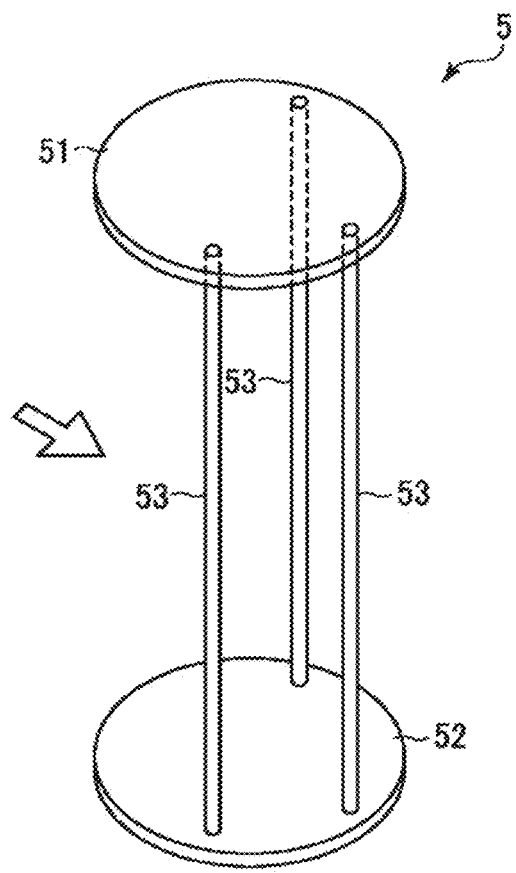
FIG. 3 is a perspective view illustrating a structure of a wafer boat.
Figure 4:
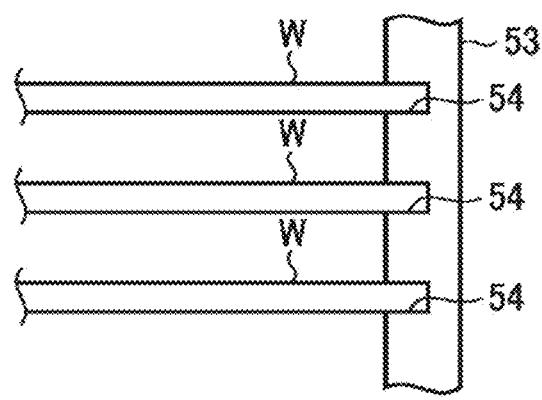
FIG. 4 is a diagram illustrating a state in which wafers are inserted into grooves formed in a pillar of the wafer boat.

As illustrated in FIG. 3, the wafer boat 5 includes a ceiling plate 51, a bottom plate 52, and a plurality of, e.g., three pillars 53 for connecting the ceiling plate 51 and the bottom plate 52. In addition, as illustrated in FIG. 4, a plurality of grooves 54 is formed in the pillar 53. In the related art, the wafers W are supported by the wafer boat 5 by fitting the wafers W into the respective grooves 54. The wafers W are carried into and out from the wafer boat 5 in a direction indicated by an arrow in FIG. 3 without the pillars 53.

Figure 5:
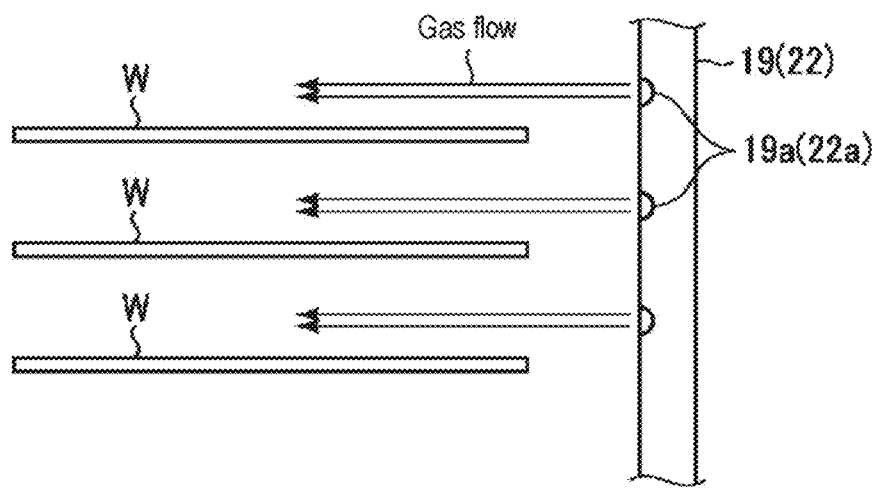
FIG. 5 is a schematic diagram illustrating a flow of a gas supplied to wafers in a conventional film forming apparatus.

When a gas is supplied to the wafers W supported by the wafer boat 5 by the conventional method, as illustrated in FIG. 5, a gas flow is provided as a side flow horizontal to the process surfaces of the wafers W from the gas discharge holes 19a and 22a respectively formed in the gas injectors 19 and 22.

Figure 6:
FIG. 6 is a schematic diagram illustrating an example of a film thickness in-plane distribution when a film is formed by the gas flow in the conventional film forming apparatus.
Figure 7:
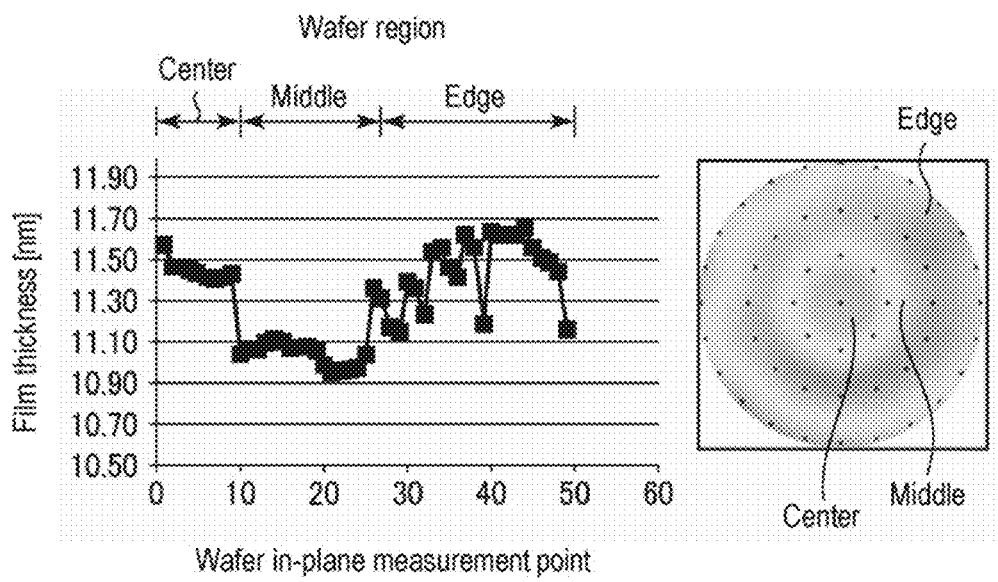
FIG. 7 is a diagram illustrating a film thickness measurement result available when an $HfO_2$ film is actually formed by the gas flow in the conventional film forming apparatus.

However, in the case of such a side flow, there arises a problem that a sufficient film thickness uniformity cannot be obtained in the wafer surface. Particularly, in the case of a high-k film such as an $HfO_2$ film, as illustrated in FIG. 6, the film thickness increases in an edge portion and a center portion of the wafer and decreases between them, such that a mountain-valley may be formed in the in-plane direction. A film thickness measurement result obtained by an actual CTR scattering of the $HfO_2$ film is illustrated in FIG. 7. As can be seen from FIG. 7, in the conventional gas supply method, a desired film in-plane uniformity is not obtained.

<Experiments of Gas Flow>

Various experiments were conducted to eliminate the in-plane nonuniformity of film thickness caused by the conventional gas flow.

Experiment 1

Figure 8:
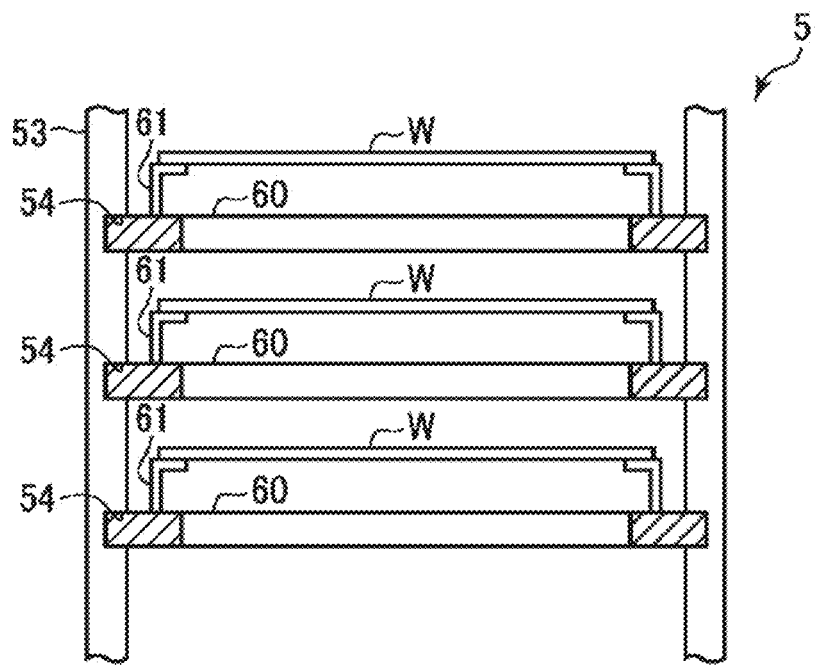
FIG. 8 is a diagram illustrating the arrangement of ring members and wafers used in experiments 1 and 2 of gas flow experiments.

First, the ring-shaped member installed to face the wafer W as described in the conventional technique was examined. FIG. 8 is a diagram illustrating the arrangement of ring-shaped members and wafers in the conventional technique. In this example, ring-shaped members 60 (opening diameter: 299 mm) are fitted into respective grooves 54 formed in the pillar 53 of the wafer boat. The plurality of ring-shaped members 60 is arranged in multiple stages along a vertical direction. The wafers W are respectively supported by support members 61 installed on the ring-shaped members 60. The ring-shaped members 60 and the wafers W were alternately arranged. A pitch between the lower face of the ring-shaped member 60 and the upper surface of the wafer was set to 3.2 mm. As a result of forming an $HfO_2$ film using such ring-shaped members 60, it was found that the film thickness of the edge portion of each wafer is reduced by the effect of the ring-shaped members 60, while the film thickness at the center of each wafer remained thick. Therefore, the film thickness in-plane uniformity was still insufficient.

Experiment 2

Next, an $HfO_2$ film was similarly formed using ring-shaped members 60 whose opening diameter was changed from 299 to 200 mm. By setting the opening diameter of the ring-shaped member 60 to 200 mm, a region at which the film thickness is thick at the center of the wafer was decreased. However, although the film thickness in-plane uniformity was somewhat improved, it was also still insufficient.

Experiment 3

Figure 9:
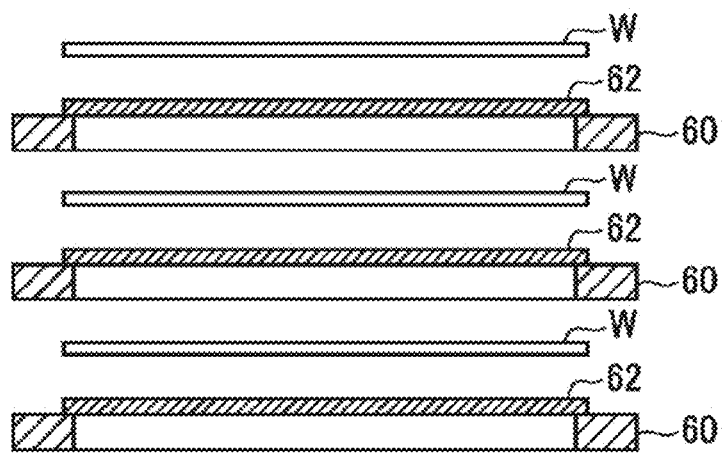
FIG. 9 is a diagram illustrating the arrangement of ring members, disk members and wafers used in experiment 3 of the gas flow experiments.

Subsequently, as illustrated in FIG. 9, as a result of closing the openings of the ring-shaped members 60 by disk members 62 such as dummy wafers, it was found that the film thickness of a portion other than the peripheral portion of the wafer is reduced and thus the film thickness in-plane uniformity was rather deteriorated.

Experiment 4

Figure 10:
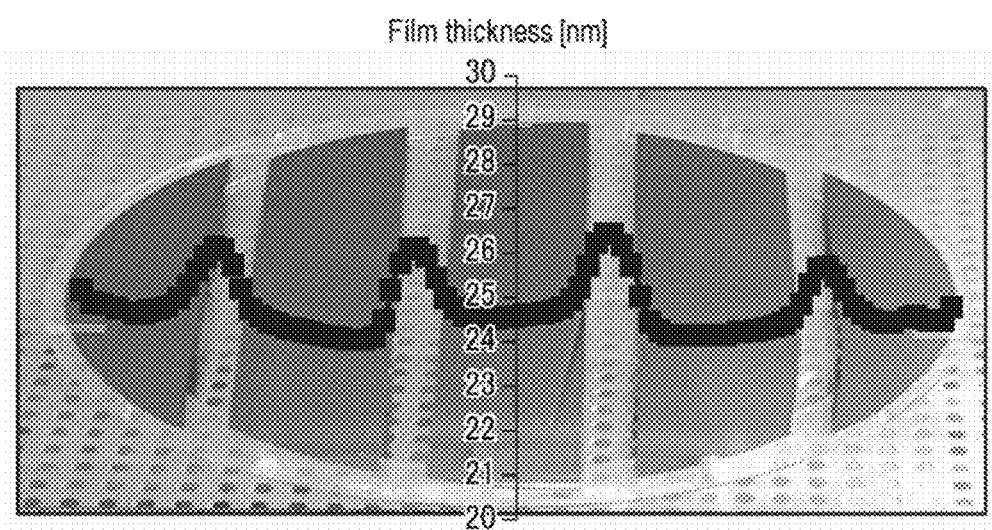
FIG. 10 is a diagram illustrating a film thickness distribution available when a film is formed by forming slit-shaped openings in the disk members of FIG. 9.
Figure 11:
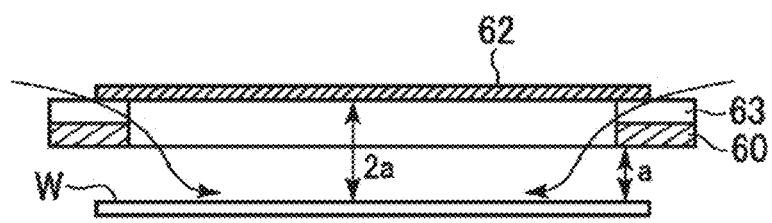
FIG. 11 is a diagram illustrating the arrangement of a ring-shaped member, a disk member in which a slit used in experiment 4 of the gas flow experiments is formed, and a wafer.

Next, as illustrated in FIG. 10, it was found that when a film is formed by forming slit-shaped openings in the disk members 62 of FIG. 9, the film thicknesses of portions corresponding to the openings are increased. From this fact, it was deemed important that the gas flow is provided from above the wafer W toward the wafer W. As illustrated in FIG. 11, a slit 63 was formed between the ring-shaped member 60 and the disk member 62 shown in FIG. 9 so that a moderate gas flow is provided from above the wafer toward the surface of the wafer W. A pitch "a" between the lower surface of the ring-shaped member 60 and the upper surface of the wafer was set to 2 to 4 mm, and a pitch "2a" between the lower face of the disk member 62 and the upper surface of the wafer was set to 4 to 8 mm. As a result of forming an $HfO_2$ film by such a gas flow, the film thickness in-plane uniformity was remarkably improved.

Figure 12:
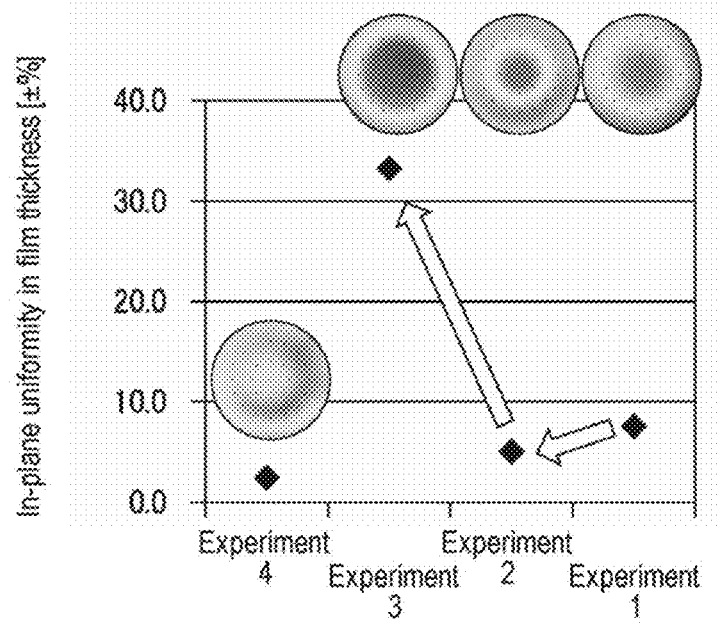
FIG. 12 is a diagram illustrating a film thickness in-plane uniformity of the wafers in experiments 1 to 4.
Figure 13:
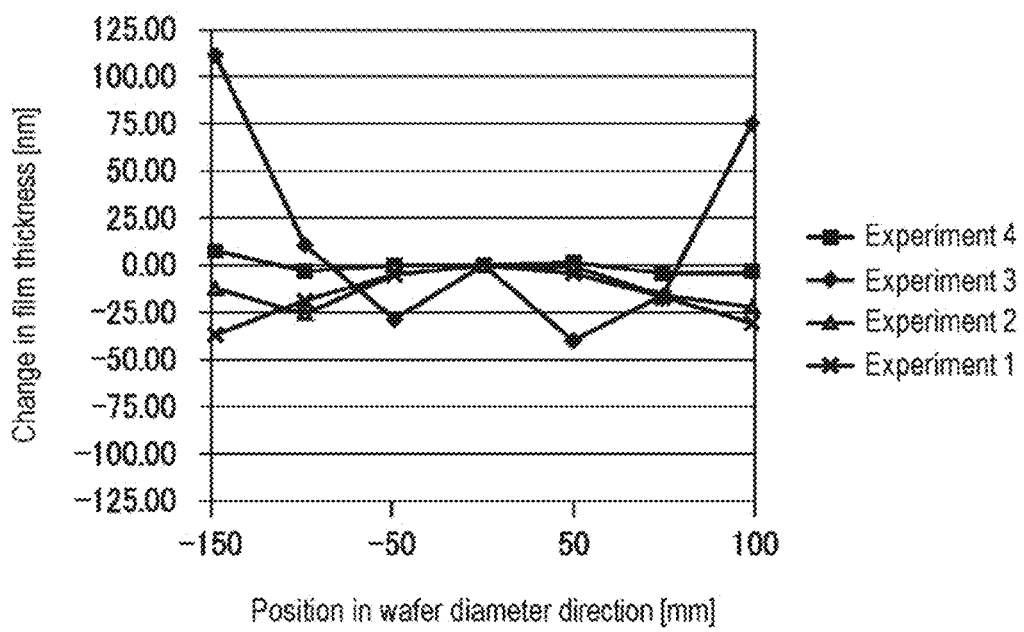
FIG. 13 is a diagram illustrating a film thickness distribution of the wafers in experiments 1 to 4.

The results of the film thickness in-plane uniformity and the results of the film thickness distribution in the above experiments 1 to 4 are illustrated in FIG. 12 and FIG. 13, respectively. From these results, experiments 1 to 3 in which the gas flow is not appropriately adjusted were completely insufficient in the film thickness in-plane uniformity. In particular, in experiment 3 in which the ring-shaped member 60 is further covered with the disk member 62 as a lid, the film thickness in-plane uniformity was remarkably deteriorated, while in experiment 4 in which the moderate gas flow was provided from above the wafer W toward the surface of the wafer W, the film thickness in-plane uniformity was greatly improved.

<Gas Flow Adjustment Member>

Therefore, in this embodiment, a gas flow adjustment member that can effectively form the gas flow of the processing gas which directs a gas flow from above the wafer W supported by the wafer boat 5 toward the surface of the wafer W is configured to be installed for each wafer W. This makes it possible to improve the film thickness in-plane uniformity. Furthermore, since the gas flow is formed from above the wafer W toward the surface thereof in this manner, the processing gas is also sufficiently supplied into a recess such as a trench, thereby improving the coverage performance.

Figure 14:
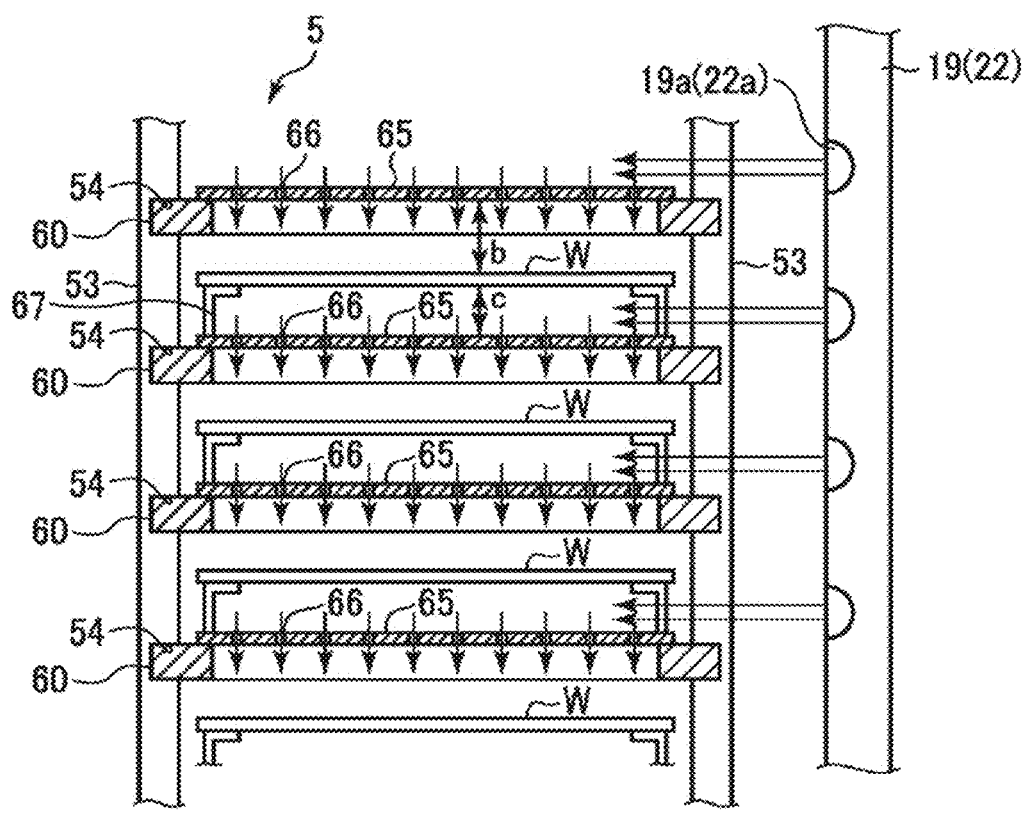
FIG. 14 is a cross sectional view including a main part including a gas flow adjustment member of a film forming apparatus according to one embodiment of the present disclosure.
Figure 15:
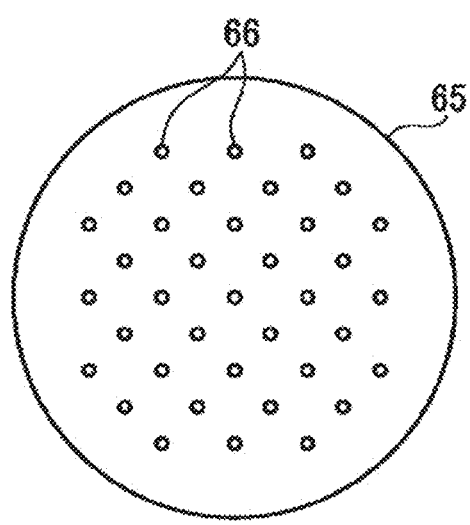
FIG. 15 is a plan view illustrating the gas flow adjustment member of the film forming apparatus according to one embodiment of the present disclosure.

FIG. 14 is a cross sectional view including a main part including the gas flow adjustment members of the film forming apparatus according to one embodiment of the present disclosure. In this embodiment, the wafer boat 5 has the structure illustrated in FIG. 3. The ring-shaped members 60 are respectively fitted into the plurality of grooves 54 formed in the pillar 53 of the wafer boat 5. The plurality of ring-shaped members 60 is arranged in multiple stages along a vertical direction. The gas flow adjustment members 65 are mounted on the plurality of ring-shaped members 60, respectively. As illustrated in FIG. 15, each of the gas flow adjustment members 65 is formed in a disk shape, and has a plurality of through holes 66 substantially evenly formed therein. Thus, the gas flow adjustment member 65 is configured as a shower plate.

A plurality of support members 67 installed so as to project upward is respectively installed on the upper surfaces of the gas flow adjustment members 65, so that the wafers W are supported on the support members 67. Thus, the gas flow adjustment members 65 and the wafers W are alternately arranged so as to face each other.

The position of the wafer boat 5 is adjusted so that the gas discharge holes 19a and 22a respectively formed in the gas injectors 19 and 22 are located directly above the respective gas flow adjustment members 65. The gas flows are discharged to flow horizontally through the gas discharge holes 19a and 22a and are then oriented downward through the through holes 66 of each of the gas flow adjustment members 65. The gas flow passing through the through holes 66 is supplied as a gas flow directing the surface of the wafer W arranged below the respective gas flow adjustment member. At this time, the gas flow directed from above the wafer W toward the surface thereof may be substantially vertical.

In other words, the gas flows passing through the plurality of through holes 66 which are evenly arranged in the gas flow adjustment member 65 are uniformly supplied toward the entire surface of the wafer W from above.

As described above, the gas flows directed from above the wafer toward the surface thereof, which have been deemed important for the film thickness in-plane uniformity, is uniformly supplied toward the entire surface of the wafer. It is therefore possible to further improve the film thickness in-plane uniformity. Furthermore, as described above, the gas flows discharged from the plurality of through holes 66 substantially evenly formed in the gas flow adjustment member 65 which is configured as a shower plate are supplied in a substantially vertical direction toward the surface of the wafer W disposed below the respective gas flow adjustment member. Thus, it is possible to more surely supply the processing gas into a recess such as a trench, thereby further improving the coverage performance.

At this time, by adjusting a distance b between the upper surface of the wafer W and the gas flow adjustment member 65 located above the respective wafer W and configured to supply the gas flow to the respective wafer W, and a distance c between the lower surface of the wafer W and the gas flow adjustment member 65 located below the respective wafer W, it is possible to adjust the film thickness in-plane uniformity.

Figure 16:
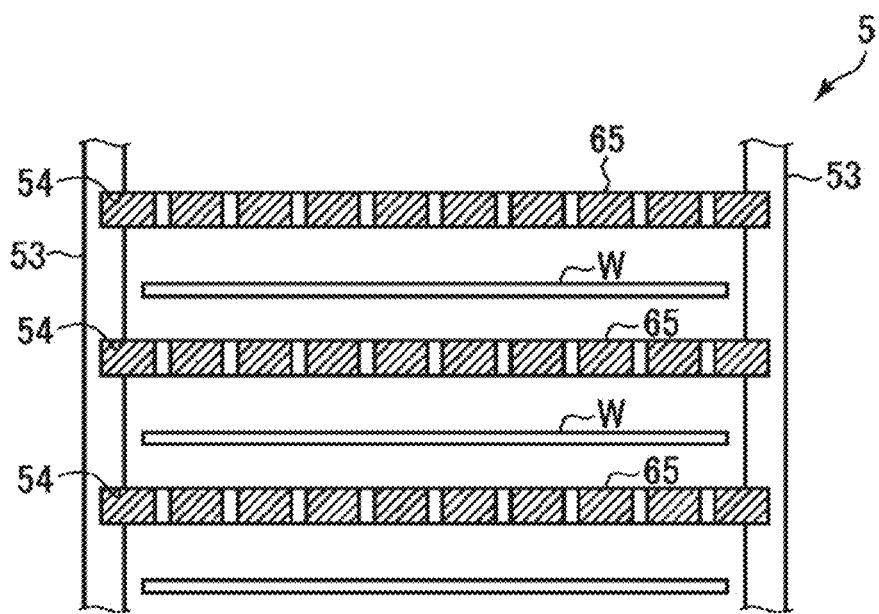
FIG. 16 is a view illustrating another example of the gas flow adjustment member.

The aforementioned embodiment is an example in which the gas flow adjustment members 65 are respectively mounted on the ring-shaped members 60, but the gas flow adjustment members 65 may be directly fitted into the respective grooves 54 formed in the pillar 53 of the wafer boat 5 without using the ring-shaped members 60, as illustrated in FIG. 16.

<Other Applications>

The embodiments of the present disclosure have been described above, but the present disclosure is not limited to the aforementioned embodiments and may be differently modified within a range that does not depart from the spirit of the present disclosure.

For example, in the aforementioned embodiment, there has been described an example in which the shower plate is installed as the gas flow adjustment member. However, the present disclosure is not limited thereto and any member may be used as long as it can supply a gas flow from above the target substrate toward the surface thereof. For example, as in experiment 4, the slit may be formed in the ring-shaped member so that a gas flow is supplied from the slit to the target substrate located below the slit.

In addition, in the aforementioned embodiment, there has been described an example in which the semiconductor wafer is used as the target substrate. However, it is to be understood that the present disclosure is not limited thereto and is also applicable to other substrates such as a glass substrate, a ceramic substrate and the like.

According to the present disclosure in some embodiments, it is possible to adjust a gas flow of a processing gas, which is discharged in a direction parallel to a target substrate from gas discharge holes of a processing gas introduction member, to be oriented from above a target substrate located below the processing gas introduction member toward a surface of the target substrate. This makes it possible to improve a film thickness in-plane uniformity of a film formed on the target substrate. Furthermore, since the gas flow directed from above the target substrate toward the surface thereof is formed in this manner, the processing gas is also sufficiently supplied into a recess such as a trench, thereby improving the coverage performance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film on a surface of a target substrate, comprising:
    a substrate holding member configured to hold a plurality of target substrates at predetermined intervals in multiple stages along a vertical direction;
    a process vessel configured to accommodate the substrate holding member which holds the plurality of target substrates;
    a processing gas introduction member each having a plurality of gas discharge holes configured to discharge a processing gas for film formation in a direction parallel to each of the plurality of target substrates accommodated in the process vessel and configured to introduce the processing gas into the process vessel;
    an exhaust mechanism configured to exhaust the interior of the process vessel; and
    a plurality of gas flow adjustment members alternately arranged with the plurality of target substrates held by the substrate holding member along the vertical direction to face the plurality of target substrates, respectively,
    wherein each of the plurality of gas flow adjustment members is configured to adjust a gas flow of the processing gas discharged horizontally above each of the plurality of target substrates from the plurality of gas discharge holes of the processing gas introduction member, to be directed from above the respective target substrate located below the respective gas flow adjustment member toward the surface of the respective target substrate, and
    wherein each of the plurality of gas flow adjustment members includes a ring-shaped member fit into a groove formed in the substrate holding member, a plate-like member mounted on the ring-shaped member to close an upper surface of the ring-shaped member, and a slit formed in the ring-shaped member so that the gas flow is directed to the surface of the target substrate located below the respective gas flow adjustment member through the slit.

2. The apparatus of claim 1, further comprising a heater installed around the process vessel and configured to heat an interior of the process vessel to a predetermined temperature.

3. The apparatus of claim 1, wherein the processing gas includes a raw material gas containing constituent elements of the film to be formed, and a reaction gas reacting with the raw material gas, and
    the processing gas introduction member includes a first gas introduction member configured to introduce the raw material gas therethrough and a second gas introduction member configured to introduce the reaction gas therethrough.

4. The apparatus of claim 3, wherein the film is formed by an ALD method that sequentially supplies the raw material gas and the reaction gas.

5. The apparatus of claim 4, wherein the film is a high-k film.

6. The apparatus of claim 5, wherein the film is an $HfO_2$ film.

7. A film forming method of forming a film on a surface of a target substrate using a film forming apparatus which includes a substrate holding member configured to hold a plurality of target substrates at predetermined intervals in multiple stages along a vertical direction, a process vessel configured to accommodate the substrate holding member that holds the plurality of target substrates, a processing gas introduction member having a plurality of gas discharge holes formed therein and for discharging a processing gas for film formation in parallel with the plurality of target substrates accommodated in the process vessel and configured to introduce the processing gas into the process vessel, an exhaust mechanism configured to exhaust an interior of the process vessel, and a plurality of gas flow adjustment members alternately arranged with the plurality of target substrates held by the substrate holding member along the vertical direction to face the plurality of target substrates, respectively, each of the plurality of gas flow adjustment members including a ring-shaped member fit into a groove formed in the substrate holding member, a plate-like member mounted on the ring-shaped member to close an upper surface of the ring-shaped member, and a slit formed in the ring-shaped member, the film forming method comprising, adjusting a gas flow of the processing gas discharged horizontally above each of the plurality of target substrates from the plurality of gas discharge holes of the processing gas introduction member to be directed from above the respective target substrate located below the processing gas introduction member toward the surface of the respective target substrate; and supplying the gas flow from the slit to the surface of the target substrate located below the respective gas flow adjustment member.

8. The method of claim 7, wherein the processing gas includes a raw material gas containing constituent elements of the film to be formed and a reaction gas reacting with the raw material gas, and the film is formed on the surface of the target substrate by the reaction of the raw material gas with the reaction gas.

9. The method of claim 8, wherein the film is formed by an ALD method that sequentially supplies the raw material gas and the reaction gas.

10. The method of claim 9, wherein the film is a high-k film.

11. The method of claim 10, wherein the film is an $HfO_2$ film.

* * * * *